US012685131B2

(12) United States Patent
Kato

(10) Patent No.: US 12,685,131 B2
(45) Date of Patent: Jul. 14, 2026

(54) SEMICONDUCTOR DEVICE AND METHOD FOR PRODUCING THE SAME

(71) Applicant: Kioxia Corporation, Tokyo (JP)

(72) Inventor: Atsushi Kato, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 534 days.

(21) Appl. No.: 18/176,904

(22) Filed: Mar. 1, 2023

(65) Prior Publication Data

US 2023/0411295 A1 Dec. 21, 2023

(30) Foreign Application Priority Data

Jun. 21, 2022 (JP) ................................. 2022-099941

(51) Int. Cl.
*H01L 23/532* (2006.01)
*H01L 21/768* (2006.01)
*H01L 23/522* (2006.01)

(52) U.S. Cl.
CPC .. *H01L 23/53238* (2013.01); *H01L 21/76831* (2013.01); *H01L 21/76849* (2013.01); *H01L 21/76877* (2013.01); *H01L 23/5226* (2013.01)

(58) Field of Classification Search
CPC ......... H01L 21/28518; H01L 21/76843; H01L 21/76831; H01L 21/76877; H01L 21/76846; H01L 21/76855; H01L 21/76897; H01L 21/76849; H01L 23/5226; H01L 23/5328
See application file for complete search history.

(56) References Cited

U.S. PATENT DOCUMENTS

| | | | | |
|---|---|---|---|---|
| 5,994,220 A | * | 11/1999 | Gonzalez | ............ H01L 23/5283 257/E23.152 |
| 11,062,942 B2 | | 7/2021 | Ren et al. | |
| 11,664,271 B2 | * | 5/2023 | Motoyama | ........ H01L 21/76831 257/774 |
| 2008/0119047 A1 | | 5/2008 | Yu et al. | |
| 2013/0140698 A1 | | 6/2013 | Lakshmanan et al. | |
| 2021/0249349 A1 | | 8/2021 | Liang et al. | |
| 2022/0028738 A1 | | 1/2022 | Park et al. | |
| 2022/0037190 A1 | * | 2/2022 | Huang | ................ H01L 21/7682 |
| 2022/0037203 A1 | | 2/2022 | Tsai et al. | |
| 2022/0359411 A1 | * | 11/2022 | Ho | .................... H01L 23/53295 |

FOREIGN PATENT DOCUMENTS

TW        200824040 A        6/2008

* cited by examiner

*Primary Examiner* — John M Parker

(74) *Attorney, Agent, or Firm* — Foley & Lardner LLP

(57) ABSTRACT

A semiconductor device includes a first insulating film; and a wiring disposed in the first insulating film. The wiring includes a first conductor containing copper; a first film formed on a side surface and a bottom surface of the first conductor and containing cobalt; a second film formed on an upper surface of the first conductor and containing copper and silicon; and a third film formed on an upper surface of the first film and containing cobalt and silicon. Respective positions of the second film and the third film are each lower than an upper surface of the first insulating film.

14 Claims, 10 Drawing Sheets

1

SEMICONDUCTOR DEVICE AND METHOD FOR PRODUCING THE SAME

CROSS-REFERENCE TO RELATED APPLICATION(S)

This application is based upon and claims the benefit of priority from Japanese Patent Application No. 2022-099941, filed Jun. 21, 2022, the entire contents of which are incorporated herein by reference.

FIELD

Embodiments described herein relate generally to a semiconductor device and a method for fabricating the same.

BACKGROUND

The development of technologies for achieving finer and denser wirings and via plugs has been advancing with a trend of the miniaturization of semiconductor devices. Such a trend necessitates an improvement of the reliability of the wirings and via plugs which became finer and therefore had high aspect ratios.

2

Figure 4A:
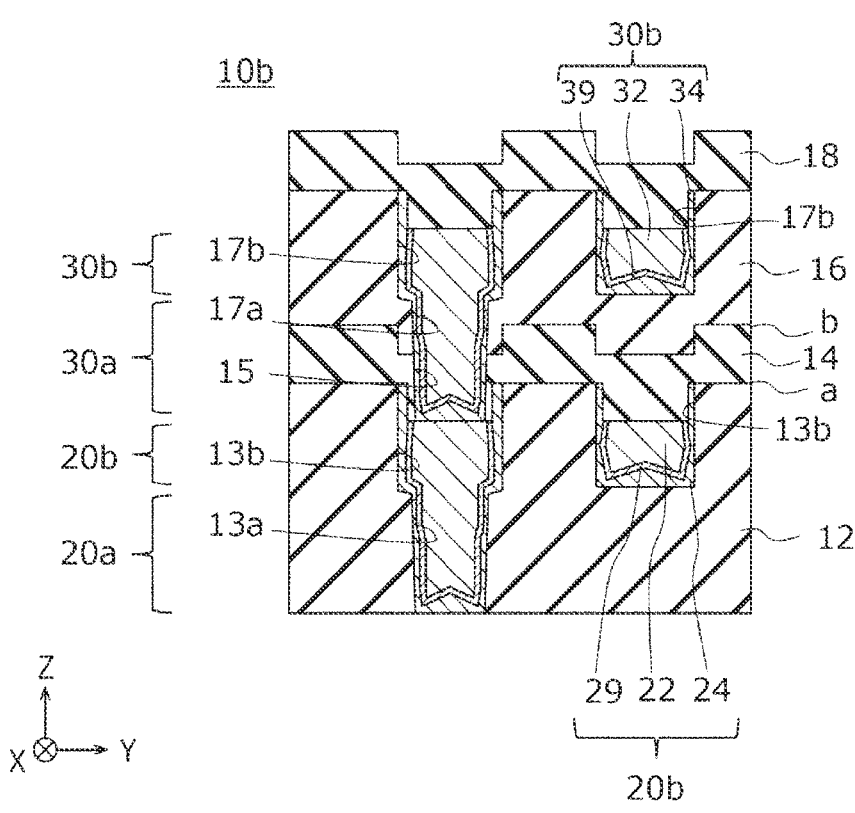
FIG. 4A is a sectional view illustrating a semiconductor device according to one embodiment of the present disclosure.
Figure 4B:
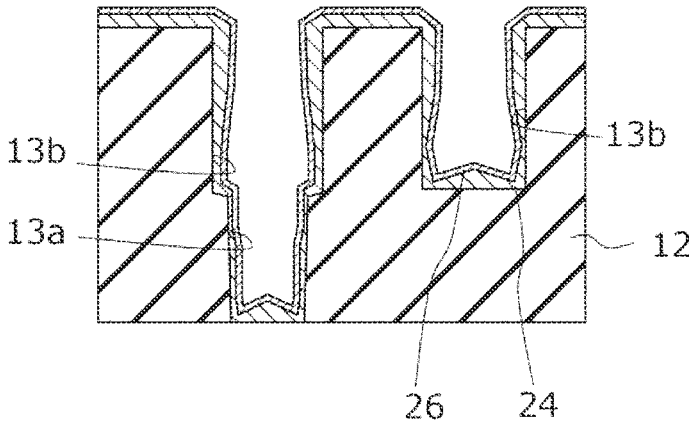

FIG. 4B is a sectional view illustrating a method for producing the semiconductor device according to the embodiment of the present disclosure.

Figure 4C:
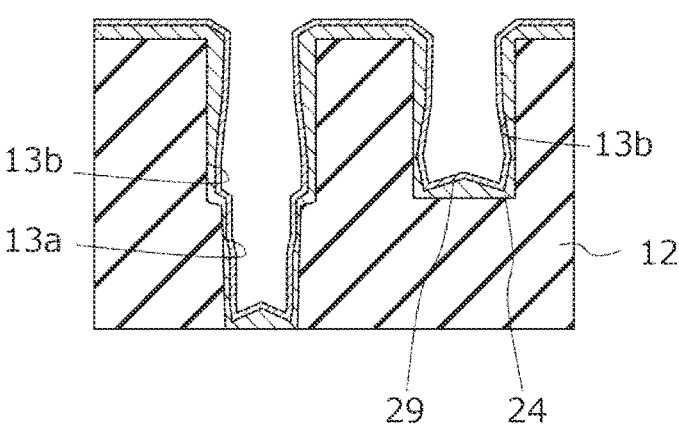

FIG. 4C is a sectional view illustrating the method for producing the semiconductor device according to the embodiment of the present disclosure.

Figure 4D:
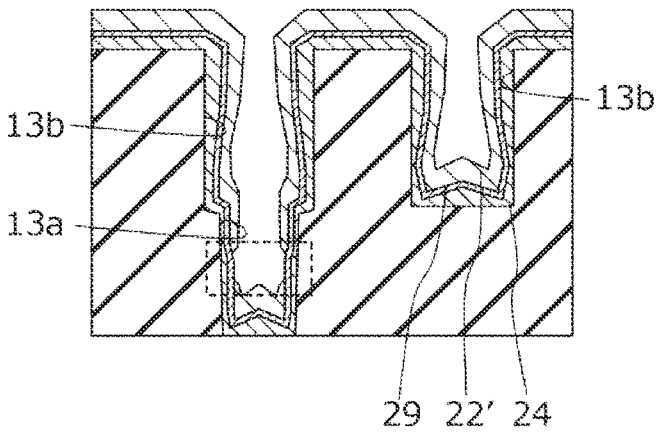

FIG. 4D is a sectional view illustrating the method for producing the semiconductor device according to the embodiment of the present disclosure.

Figure 4E:
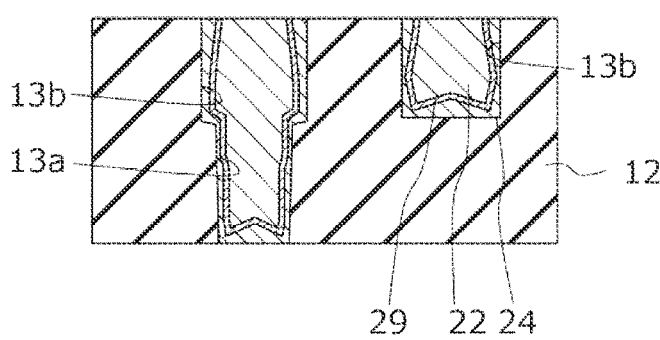

FIG. 4E is a sectional view illustrating the method for producing the semiconductor device according to the embodiment of the present disclosure.

Figure 4F:
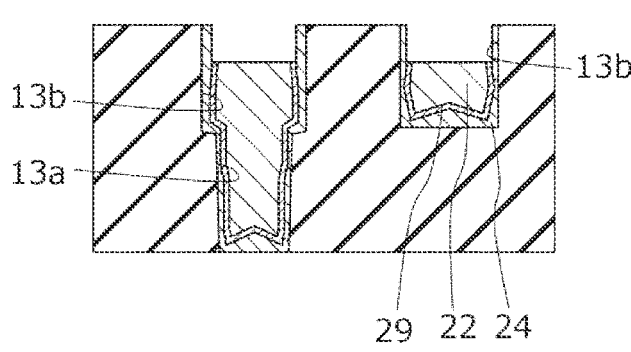

FIG. 4F is a sectional view illustrating the method for producing the semiconductor device according to the embodiment of the present disclosure.

Figure 4G:
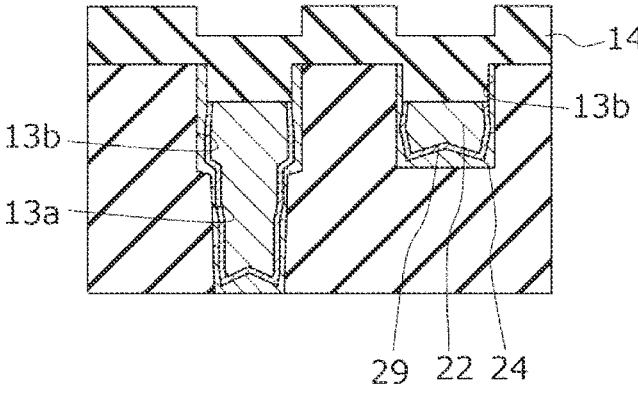

FIG. 4G is a sectional view illustrating the method for producing the semiconductor device according to the embodiment of the present disclosure.

Figure 5:
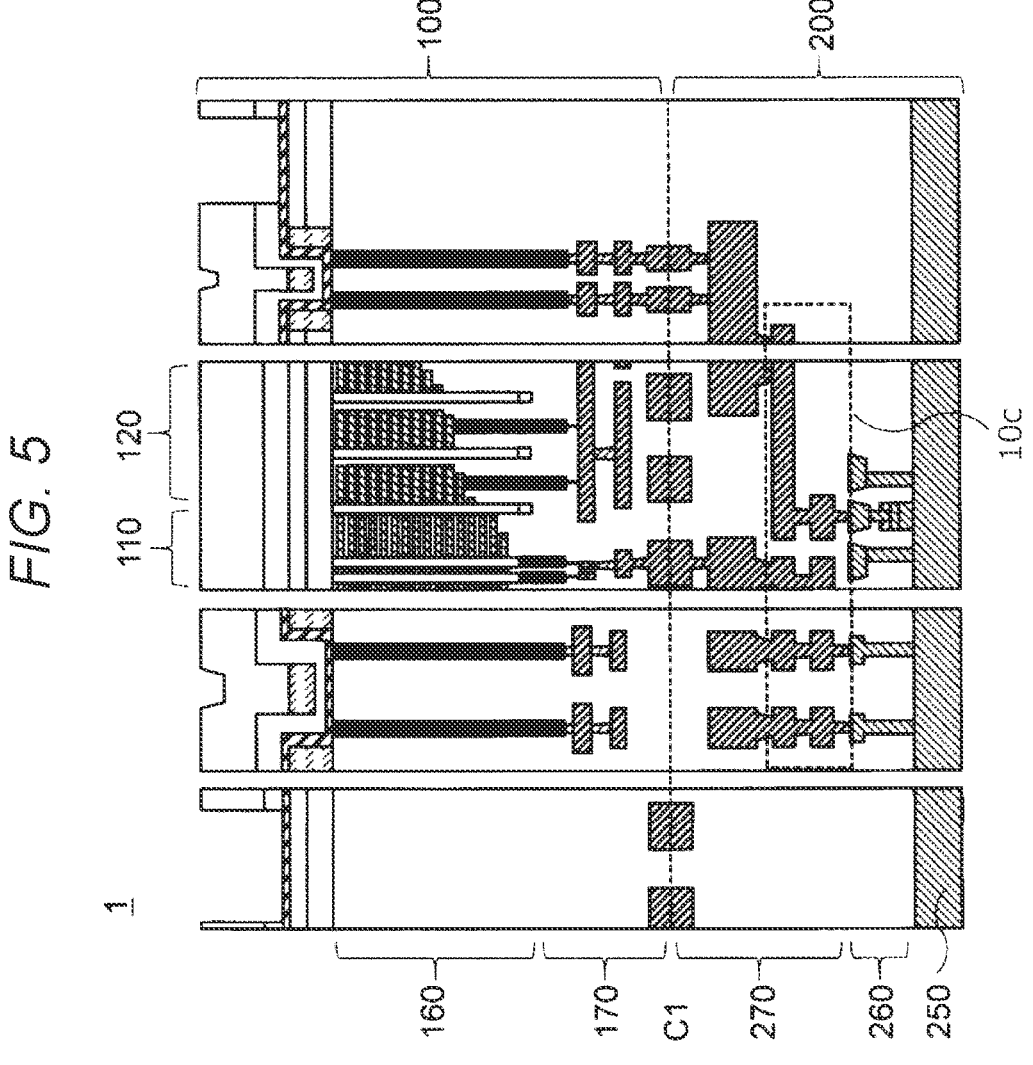

FIG. 5 is a sectional view illustrating a semiconductor device according to one embodiment of the present disclosure.

DETAILED DESCRIPTION

Embodiments provide a semiconductor device and a method for fabricating the semiconductor device, the semiconductor device and the method which can improve reliability.

In general, according to one embodiment, a semiconductor device includes a first insulating film; and a wiring disposed in the first insulating film. The wiring includes a first conductor containing copper; a first film formed on a side surface and a bottom surface of the first conductor and containing cobalt; a second film formed on an upper surface of the first conductor and containing copper and silicon; and a third film formed on an upper surface of the first film and containing cobalt and silicon. Respective positions of the second film and the third film are each lower than an upper surface of the first insulating film.

Hereinafter, embodiments of the present disclosure will be described with reference to the drawings. The embodiments are not intended for limitation. In the following embodiments, the up-and-down direction of a semiconductor substrate corresponds to a relative direction observed when a surface on which a semiconductor element is to be provided is assumed to be an upper surface, and may be different from an up-and-down direction in accordance with the acceleration of gravity. The drawings are schematic or conceptual drawings and the ratio between the portions, for example, is not always identical to the actual ratio. In the specification and drawings, any element which is similar to that described in connection with the already explained drawing is denoted by the same reference sign and detailed explanations thereof are omitted as appropriate.

First Embodiment

Configuration of a Wiring Structure

Figure 1A:
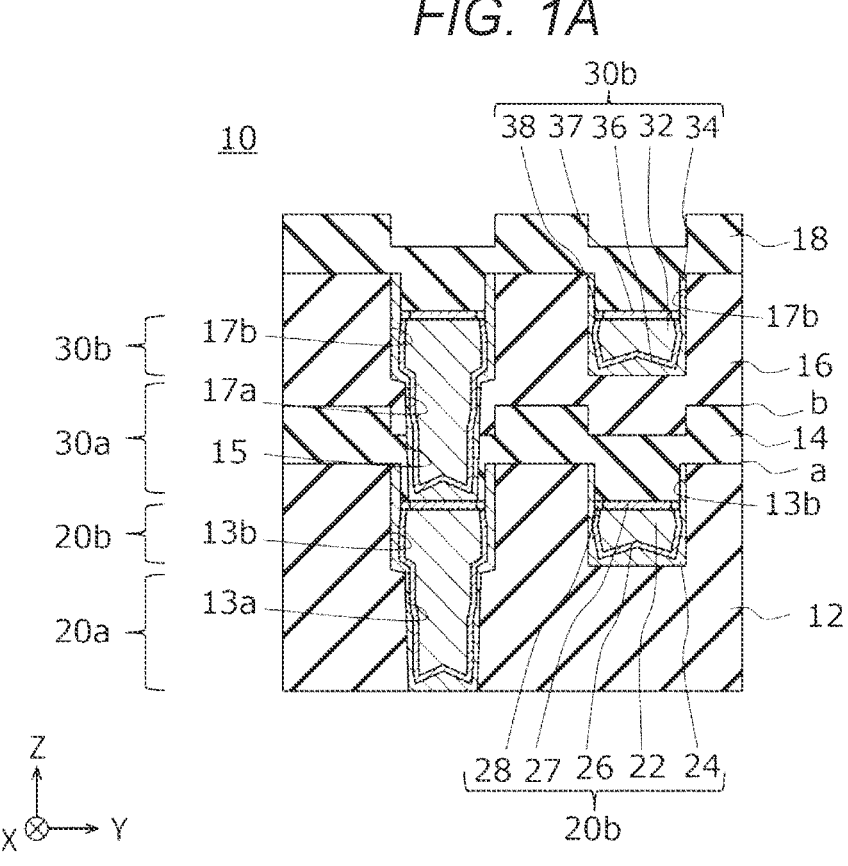
FIG. 1A is a sectional view illustrating a semiconductor device according to one embodiment of the present disclosure.

The configuration of a wiring structure of a semiconductor device according to the present embodiment will be described using FIG. 1A. FIG. 1A is a sectional view illustrating a wiring structure 10 of the semiconductor device according to the present embodiment.

As shown in FIG. 1A, the wiring structure 10 includes: a first insulating film 12; a second insulating film 14; a third insulating film 16; a fourth insulating film 18; a lower-layer wiring 20*b* that is placed in the first insulating film 12; an upper-layer wiring 30*b* that is placed in the third insulating film 16; a plug 20*a* that connects a wiring (not shown in FIG. 1A), which is located below the lower-layer wiring 20*b*, and the lower-layer wiring 20*b*; and a plug 30*a* that connects the lower-layer wiring and the upper-layer wiring 30*b*. The first insulating film 12, the second insulating film 14, the third insulating film 16, and the fourth insulating film 18 are stacked on a substrate (not shown in FIG. 1A) in this order. The first insulating film 12 and the second insulating film 14 include a surface a at which they are in contact with each other, and the second insulating film 14 and the third insulating film 16 include a surface b at which they are in contact with each other.

The lower-layer wiring 20*b* extends in an x direction, for example, and a plurality of lower-layer wirings 20*b* are arranged in a y direction. Therefore, the lower-layer wirings 20*b* are adjacent to one another in the y direction. The upper-layer wiring is placed above the lower-layer wiring 20*b* in a z direction. As in the case of the lower-layer wiring 20*b*, the upper-layer wiring 30*b* extends in the x direction and a plurality of upper-layer wirings 30*b* are arranged in the y direction.

In an example shown in FIG. 1A, the plugs 20*a* and 30*a* are provided in such a way as to connect to left-hand wirings. Other plugs 20*a* and 30*a* are connected to right-hand wirings in the x direction, for example.

The first insulating film 12 includes a first through via hole 13*a* and a recess portion 13*b* with an opening in the surface a. The recess portion 13*b* connects to the first through via hole 13*a*. The plug 20*a* is placed in the first through via hole 13*a*. The plug 20*a* includes a first conductor 22, a first barrier film 24, and a first film 26. The lower-layer wiring 20*b* is placed in the recess portion 13*b*. The lower-layer wiring 20*b* includes the first conductor 22, the first barrier film 24, the first film 26, a second film 27, and a third film 28. The first barrier film 24 is placed in the first through via hole 13*a* and the recess portion 13*b* in such a way as to be in contact with the first insulating film 12. The first film 26 is placed in the first through via hole 13*a* and the recess portion 13*b* in such a way as to be in contact with the first barrier film 24. The first conductor 22 is placed in the first through via hole 13*a* and the recess portion 13*b* in such a way as to be in contact with the first film 26. The first barrier film 24, the first conductor 22, and the first film 26 are exposed from the first insulating film 12 in a position lower than the surface a (in a first through via hole 13*a*-side position). The first barrier film 24 is in contact with the second insulating film 14 in the recess portion 13*b*. In a position lower than the surface a (in a first through via hole 13*a*-side position), the first conductor 22 is in contact with the second insulating film 14 with the second film 27 placed therebetween. In a position lower than the surface a (in a first through via hole 13*a*-side position), the first film 26 is in contact with the second insulating film 14 with the third film 28 placed therebetween. Apart from the upper surface thereof, the first conductor 22 is covered with the first film 26 and the first barrier film 24. That is, it is preferable that the first film 26 and the first barrier film 24 are placed on the internal surface and the bottom surface of the recess portion 13*b* and the first conductor 22 does not contact the first insulating film 12.

More specifically, the first film 26 is provided on the side surface and the bottom surface of the first conductor 22. The second film 27 is provided on the upper surface of the first conductor 22. The third film 28 is provided on the upper surface of the first film 26. The first barrier film 24 is provided between the first film 26 and the first insulating film 12 and between the third film 28 and the first insulating film 12. It is to be noted that, in the example shown in FIG. 1A, the first barrier film 24 extends to the surface a. Moreover, the second film 27 and the third film 28 are located on a first through via hole 13*a*-side with respect to the upper surface (the surface a) of the first insulating film 12.

The second insulating film 14 has a second through via hole 15 passing therethrough from the surface a to the surface b. The second through via hole 15 connects to the recess portion 13*b*. A part of the plug 30*a* is placed in the second through via hole 15. The plug 30*a* that is placed in the second through via hole 15 includes a first barrier film 34, a first conductor 32, and a first film 36. The configuration of the plug 30*a* is nearly identical to the configuration of the plug 20*a*. The first barrier film 34, the first conductor 32, and the first film 36 are placed in the second through via hole 15. The first barrier film 34 of the plug 30*a* is placed in the second through via hole 15 in such a way as to be in contact with the second film 27 and the second insulating film 14. The first conductor 32 of the plug 30*a* is placed in the second through via hole 15 in such a way as to be in contact with the first film 36.

The third insulating film 16 includes a third through via hole 17*a* and a recess portion 17*b*. The third through via hole 17*a* connects to the second through via hole 15. The recess portion 17*b* connects to the third through via hole 17*a*. A part of the plug 30*a* is placed in the third through via hole 17*a*. The plug that is placed in the third through via hole 17*a* includes the first barrier film 34, the first conductor 32, and the first film 36. The upper-layer wiring 30*b* is placed in the recess portion 17*b*. The upper-layer wiring 30*b* includes the first barrier film 34, the first conductor 32, the first film 36, a second film 37, and a third film 38. The configuration of the upper-layer wiring is nearly identical to the configuration of the lower-layer wiring 20*b*. The first barrier film 34, the first conductor 32, and the first film 36 are placed in the third through via hole 17*a* and the recess portion 17*b*. The first barrier film 34 is placed in the third through via hole 17*a* and the recess portion 17*b* in such a way as to be in contact with the third insulating film 16. The first film 36 is placed in the third through via hole 17*a* and the recess portion 17*b* in such a way as to be in contact with the first barrier film 34. The first conductor 32 is placed in the third through via hole 17*a* and the recess portion 17*b* in such a way as to be in contact with the first film 36. The first barrier film 34, the first conductor 32, and the first film 36 are continuously placed in the second through via hole 15, the third through via hole 17*a*, and the recess portion 17*b*. Apart from the upper surface thereof, the first conductor 32 is covered with the first barrier film 34 and the first film 36. That is, it is preferable that the first barrier film 34 is placed on the internal surfaces of the second through via hole 15, the third through via hole 17*a*, and the recess portion 17*b* and a surface in contact with the second film 27 and the first conductor 32 does not contact the second insulating film 14 and the third insulating film 16.

The first insulating film 12 and the third insulating film 16 may contain silicon and oxygen and may be silicon oxide films, for example. The second insulating film 14 and the fourth insulating film 18 may contain silicon and nitrogen and may be silicon nitride films or silicon carbonitride films, for example. The first conductor 22 may contain copper, cobalt, nickel, manganese, copper-manganese (CuMn), or copper-aluminum (CuAl). The first barrier film 24 may contain titanium, titanium nitride, tantalum, or tantalum nitride.

It is to be noted that, in the following embodiment, a case where the first conductor 22 contains copper will be described. Moreover, the first barrier film 24 contains tantalum nitride, for example. Furthermore, the first film 26 contains cobalt (Co), for example. The second film 27 contains copper silicide (CuSi$_x$), for example. Copper silicide contains at least one of Cu$_3$Si and Cu$_{15}$Si$_4$, for example. The third film 28 contains cobalt silicide (CoSi$_y$), for example. Cobalt silicide contains at least one of Co$_2$Si, CoSi, and CoSi$_2$, for example.

The wiring structure 10 according to the present embodiment includes the first film 26, the second film 27, and the third film 28. The first film 26 is provided on the side surface and the bottom surface of the first conductor 22 and contains cobalt. As will be described later with reference to FIG. 1B, the first film 26 can be formed in a conformal manner. This makes it possible to support a discontinuous portion of a seed layer 22', which will be described later, of the first conductor 22 and embed the first conductor 22 more reliably.

Moreover, the position of the upper surfaces of the second film 27 and the third film 28 or the position of the upper surfaces of the first conductor 22 and the first film 26 is lower than the upper surface (the surface a) of the first insulating film 12. This makes it possible to extend the distance D between the adjacent lower-layer wirings 20b as will be described later and increase a breakdown voltage.

Furthermore, the second insulating film 14 is provided on the upper surface of the first insulating film 12, the upper surface of the second film 27, and the upper surface of the third film 28. The second insulating film 14 is a silicon carbonitride film, for example, and contains a silicon compound. The second film 27 and the third film 28 are films containing silicide, which makes it possible to improve the interfacial adhesion between the first conductor 22 and the second insulating film 14 and between the first film 26 and the second insulating film 14 and improve the reliability of the wirings.

Method for Producing the Wiring Structure

FIGS. 1B to 1H are sectional views illustrating a method for producing the wiring structure 10 of the semiconductor device according to the present embodiment.

Figure 1B:
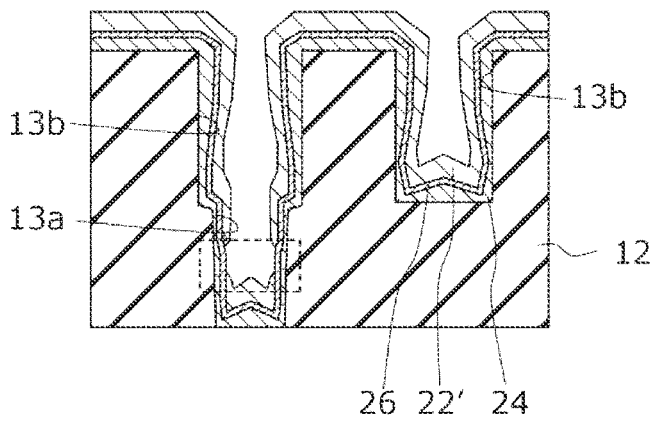
FIG. 1B is a sectional view illustrating a method for producing the semiconductor device according to the embodiment of the present disclosure.

As shown in FIG. 1B, first, a first through via hole 13a and a recess portion 13b are formed in the upper surface of a first insulating film 12. A resist pattern is formed on the first insulating film 12 by photolithography in such a way that regions where the first through via hole 13a and the recess portion 13b are to be formed are exposed. Etching is performed on the first insulating film 12 exposed from the resist pattern, whereby the first through via hole 13a and the recess portion 13b are formed. The first insulating film 12 may contain silicon and oxygen and may be a silicon oxide film, for example.

Next, a first barrier film 24 and a first film 26 are formed in this order on the internal surface and the bottom surface of the first through via hole 13a and the recess portion 13b. The first barrier film 24 is formed by sputtering, for example. The first film 26 is formed by chemical vapor deposition (CVD), for example. This makes it possible to form the first film 26 in a conformal manner.

Figure 1C:
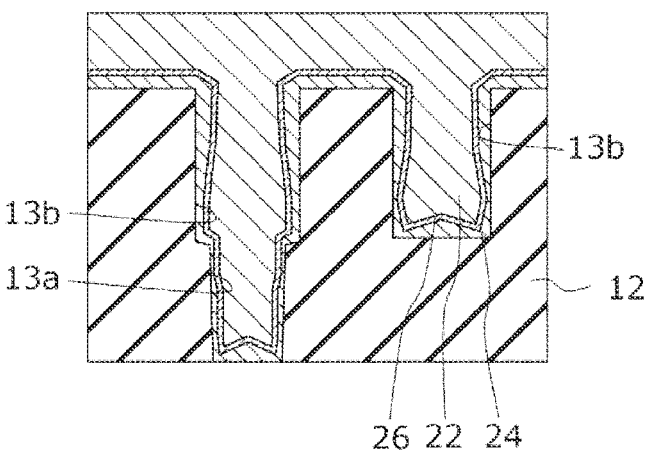
FIG. 1C is a sectional view illustrating the method for producing the semiconductor device according to the embodiment of the present disclosure.

Next, a lower-layer wiring 20b is formed by forming a first conductor 22 in the first through via hole 13a and the recess portion 13b with the first barrier film 24 and the first film 26 placed therebetween. The first conductor 22 is formed by electrolytic plating, for example. As shown in FIGS. 1B and 1C, for example, after the formation of a seed layer 22' on the first film 26 by sputtering, the first conductor 22 may be formed by electrolytic plating via the seed layer 22'. In the formation of the seed layer 22', the presence of the first film 26 prevents the seed layer 22' from being discontinued in a spot indicated by a dashed line of FIG. 1B, which might cause a void to appear. The first conductor 22 contains copper, for example. The first barrier film 24 contains tantalum nitride, for example. The first conductor 22 is covered with the first barrier film 24, which makes it possible to prevent a component contained in the first conductor 22 from diffusing into the first insulating film 12.

Figure 1D:
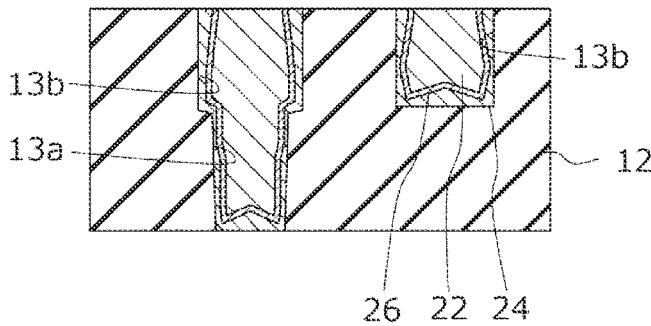
FIG. 1D is a sectional view illustrating the method for producing the semiconductor device according to the embodiment of the present disclosure.

Then, annealing is performed and, as shown in FIG. 1D, the excess first conductor 22, first barrier film 24, and first film 26 are removed to the upper surface of the first insulating film 12 by chemical mechanical polishing. That is, the upper surface of the first insulating film 12, the upper surface of the first film 26, and the upper surface of the first conductor 22 are polished.

Figure 1E:
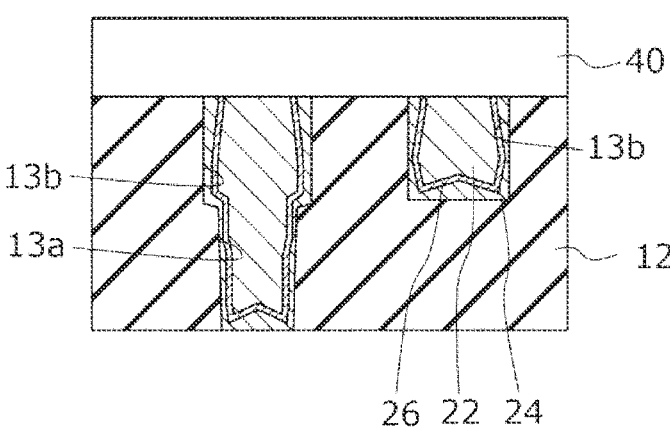
FIG. 1E is a sectional view illustrating the method for producing the semiconductor device according to the embodiment of the present disclosure.

Next, as shown in FIG. 1E, a material film 40 containing silicon (Si) is formed on the upper surface of the first insulating film 12, the upper surface of the first film 26, and the upper surface of the first conductor 22. The material film 40 contains amorphous silicon, for example. The material film 40 is formed by CVD or physical vapor deposition (PVD), for example. It is preferable that the formation of the material film 40 is performed at a low temperature to prevent a second film 27 and a third film 28, which are formed in a subsequent process, from being formed. The formation of the material film 40 is performed at 250° C. or lower, for example.

Figure 1F:
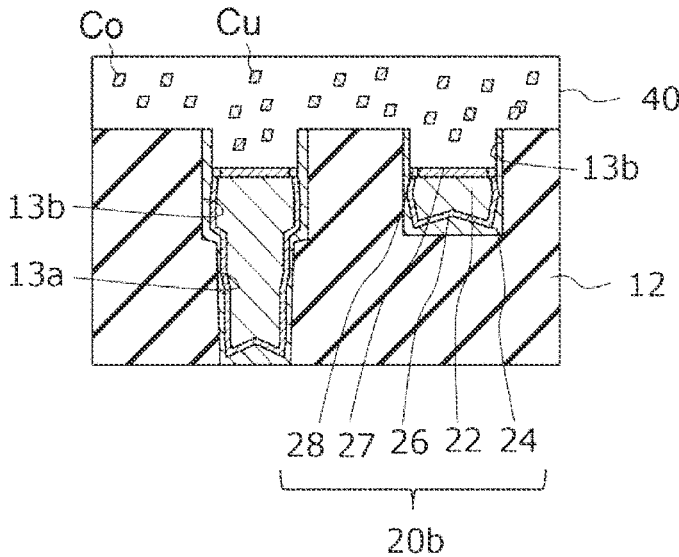
FIG. 1F is a sectional view illustrating the method for producing the semiconductor device according to the embodiment of the present disclosure.

Next, as shown in FIG. 1F, treatment such as annealing, for example, is performed. By annealing, a part of the first conductor 22 and a part of the first film 26 are removed from the side where the material film 40 is located, whereby a recess portion is formed and the second film 27 and the third film 28 are formed. More specifically, copper of the first conductor 22 and cobalt of the first film 26 are diffused into the material film 40 by annealing, whereby the position of the upper surfaces of the first conductor 22 and the first film 26 becomes lower than the first insulating film 12. At the same time, the second film 27 is formed on the upper surface of the first conductor 22, that is, between the first conductor 22 and the material film 40 by annealing. The third film 28 is formed on the upper surface of the first film 26, that is, between the first film 26 and the material film 40.

The higher the temperature of annealing becomes, the thicker the formed second film 27 and third film 28 tend to be. In this case, for example, there is a possibility that wiring resistance will increase. For this reason, annealing is performed under conditions that prevent the second film 27 and the third film 28 from becoming too thick while allowing copper and cobalt to diffuse.

The anneal temperature is preferably 300° C. or lower, for example. Annealing treatment may be performed at 300° C. for 30 seconds, for example, or may be performed in stages in a manner such as the following: annealing is performed at 250° C. for 20 seconds and then performed at 300° C. for 20 seconds.

Copper and cobalt contained in the first conductor 22 and the first film 26, respectively, are more likely to diffuse into the material film 40 because the diffusion coefficients thereof are relatively high. On the other hand, tantalum contained in the first barrier film 24 is less likely to diffuse into the material film 40 because the diffusion coefficient thereof is relatively low. As a result, almost no first barrier film 24 is removed. The diffusion coefficient of copper (Cu)

in the material film 40 (Si) is about $2.9 \times 10^{-6}$ (cm$^2$/sec) under the following annealing conditions: at 400° C. for 90 seconds, for example. The diffusion coefficient of cobalt (Co) in the material film 40 (Si) is about $6.6 \times 10^{-12}$ (cm$^2$/sec) under the following annealing conditions: at 400° C. for 90 seconds, for example. The diffusion coefficient of tantalum (Ta) in the material film 40 (Si) is about $2.0 \times 10^{-14}$ (cm$^2$/sec) under the following annealing conditions: at 400° C. for seconds, for example.

It is to be noted that tantalum silicide is less likely to be formed between the first barrier film 24 containing tantalum nitride and the material film 40. This is because a temperature at which tantalum silicide is formed is higher than a temperature at which copper silicide and cobalt silicide are formed.

Moreover, in a process shown in FIG. 1F, diffusion of a constituent material may be performed at a contact surface between the first insulating film 12 and the material film 40. In this case, the concentration of a constituent material (for example, silicon) of the material film 40 becomes high near the upper surface of the first insulating film 12 shown in FIG. 1A.

Figures 1G, 1H:
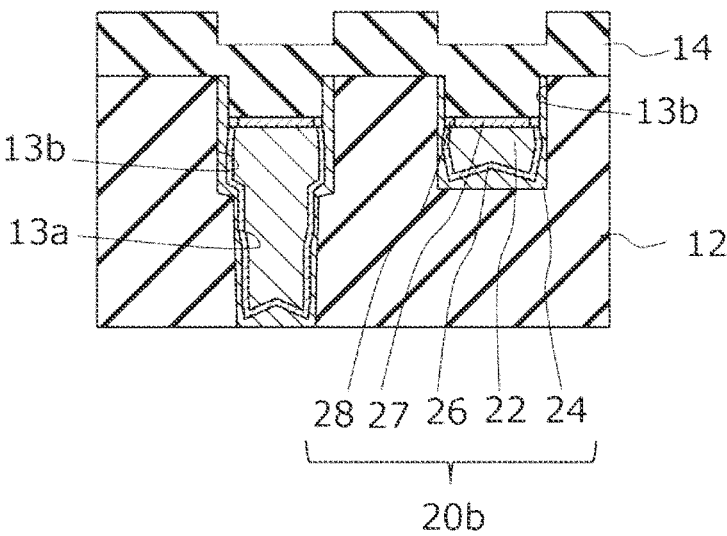
FIG. 1G is a sectional view illustrating the method for producing the semiconductor device according to the embodiment of the present disclosure.
FIG. 1H is a sectional view illustrating the method for producing the semiconductor device according to the embodiment of the present disclosure.

Next, as shown in FIG. 1G, the material film 40 in which copper and cobalt are diffused is removed. The material film 40 is removed by wet etching, for example. A chemical solution that is used for wet etching is trimethyl-2 hydroxy-ethyl ammonium hydroxide (TMY), for example. The second film 27 and the third film 28 remain on the first conductor 22 and the first film 26, respectively. By removing a part of the first conductor 22 from the upper surface side, it is possible to extend the distance D between the adjacent lower-layer wirings 20b. This makes it possible to increase a breakdown voltage. As a result, it is possible to improve the reliability of the wirings.

It is to be noted that the first barrier film 24 containing tantalum nitride is relatively less likely to be removed. Tantalum is oxidized to an insulator and therefore has little effect on the distance D between the lower-layer wirings 20b and a breakdown voltage.

Next, as shown in FIG. 1H, a second insulating film 14 is formed on the first insulating film 12 having the lower-layer wiring 20b, on the second film 27, and on the third film 28. The second insulating film 14 is a silicon carbonitride film, for example. Then, a third insulating film 16 is formed on the second insulating film 14. The second insulating film 14 and the third insulating film 16 are deposited using a CVD apparatus, for example. Then, as shown in FIG. 1A, a recess portion 17b in which an upper-layer wiring 30b is to be placed and a second through via hole 15 and a third through via hole 17a that reach the lower-layer wiring 20b from the recess portion 17b are formed in the second insulating film 14 and the third insulating film 16. The recess portion 17b and the second through via hole 15 and the third through via hole 17a are formed in the following manner: a resist pattern patterned in the shapes of the second through via hole 15 and the third through via hole 17a is formed on a hard mask, such as metal, patterned in the shape of the recess portion 17b by photolithography and etching is then performed. The formation of the second through via hole 15 and the third through via hole 17a in the recess portion 17b causes the upper surface of the second film 27 to be exposed at the bottom of the second through via hole 15. The second insulating film 14 may contain silicon and nitrogen and may be a silicon nitride film or a silicon carbonitride film, for example. The third insulating film 16 may contain silicon and oxygen and may be a silicon oxide film, for example.

Then, a first conductor 32 is formed in the second through via hole 15, the third through via hole 17a, and the recess portion 17b with a first barrier film 34 and a first film 36 placed therebetween. The first barrier film 34 is formed by sputtering, for example. The first film 36 is formed by CVD, for example. The first conductor 32 is formed by electrolytic plating, for example. The first conductor 32 contains copper, for example. The first barrier film 34 contains tantalum nitride, for example.

By forming a plug 30a and an upper-layer wiring 30b and then forming a fourth insulating film 18, it is possible to produce the wiring structure 10 shown in FIG. 1A.

Comparative Example

Figure 2A:
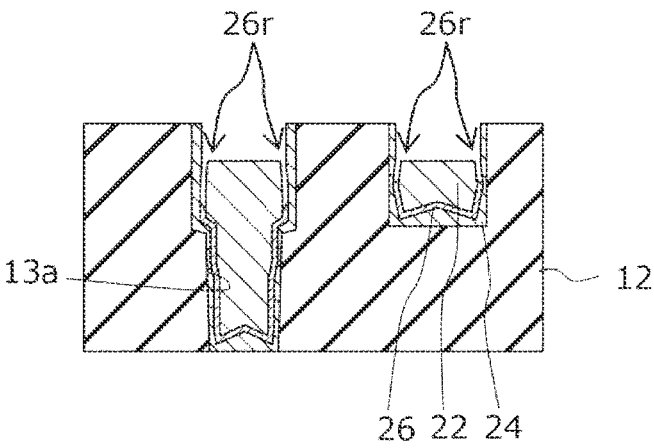
FIG. 2A is a sectional view illustrating a method for producing a semiconductor device according to a comparative example.
Figure 2B:
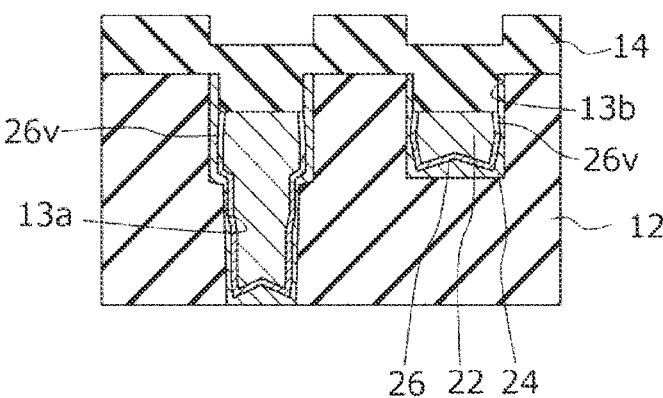
FIG. 2B is a sectional view illustrating the method for producing the semiconductor device according to the comparative example.

FIGS. 2A and 2B are sectional views illustrating a method for producing a wiring structure of a semiconductor device according to a comparative example. The method for producing the wiring structure according to the comparative example is different from the first embodiment in a method for removing a part of the first conductor 22. An explanation identical to that of the first embodiment is omitted; here, a difference from the configuration of the wiring structure 10 according to the first embodiment is explained.

After the excess first conductor 22, first barrier film 24, and first film 26 are removed by chemical mechanical polishing (see FIG. 1D), a part of the first film 26 and a part of the first conductor 22 are removed (recessed) from the upper surface side as shown in FIG. 2A. A part of the first conductor 22 is removed by wet etching, for example, and a part of the first film 26 is also removed with the part of the first conductor 22. Here, the etching rate of the first film 26 is higher than the etching rate of the first conductor 22. Thus, in an example shown in FIG. 2A, a recess portion 26r is formed.

As shown in FIG. 2B, when the second insulating film 14 is formed, the recess portion 26r causes a void 26v to appear.

By contrast, in the first embodiment, a part of the first conductor 22 and a part of the first film 26 are removed by diffusion into the material film 40. This makes it possible to reduce the ratio of the rate of removal of the first film 26 to the rate of removal of the first conductor 22 and prevent the appearance of the void 26v. As a result, it is possible to improve the reliability of the wirings.

Modification

Configuration of a Wiring Structure

Figure 3A:
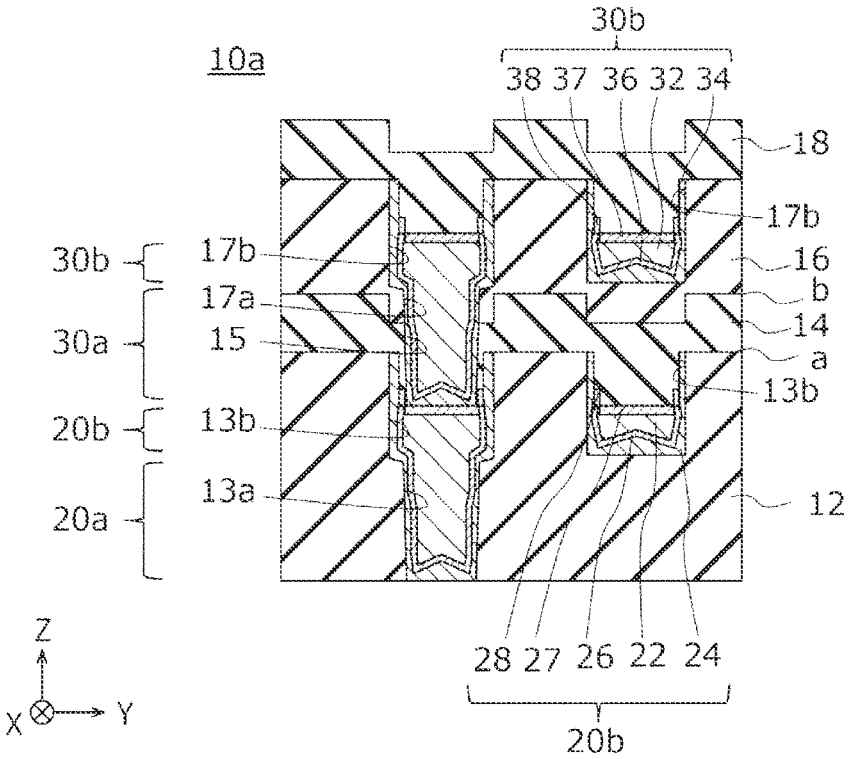
FIG. 3A is a sectional view illustrating a semiconductor device according to a modification.

The configuration of a wiring structure of a semiconductor device according to the present embodiment will be described using FIG. 3A. FIG. 3A is a sectional view illustrating a wiring structure 10a of the semiconductor device according to the present embodiment. The configuration of the wiring structure 10a according to the present embodiment is nearly identical to the configuration of the wiring structure 10 according to the first embodiment except that there is a difference in the height of the upper surface between the second film 27 and the third film 28. An explanation identical to that of the first embodiment is omitted; here, a difference from the configuration of the wiring structure 10 according to the first embodiment is explained.

The height of the position of the upper surface of the second film 27 may be different from that of the upper surface of the third film 28. A difference in height between the second film 27 and the third film 28 is caused by a difference in diffusion velocity between copper and cobalt, for example.

When copper is more likely to diffuse than cobalt, the position of the upper surface of the second film 27 is lower than the upper surface of the third film 28. In this case, a void which might appear at the time of the formation of the second insulating film 14 is less likely to appear as compared with a case where the position of the upper surface of the second film 27 is higher than the upper surface of the third film 28 (see FIGS. 2A and 2B).

Method for Producing the Wiring Structure

Figure 3B:
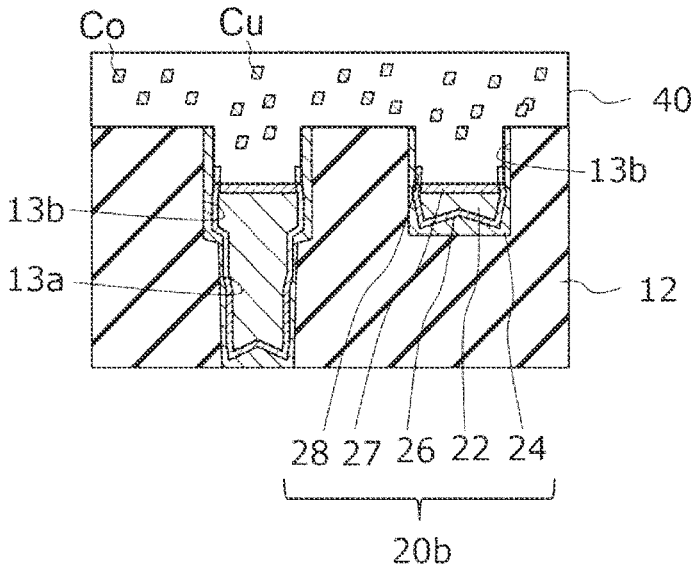
FIG. 3B is a sectional view illustrating a method for producing the semiconductor device according to the modification.

FIG. 3B is a sectional view illustrating a method for producing the wiring structure 10*a* of the semiconductor device according to the present embodiment. The method for producing the wiring structure 10*a* according to the present embodiment is different from the first embodiment in that there is a difference in the rate of removal between the first conductor 22 and the first film 26. An explanation identical to that of the first embodiment is omitted; here, a difference from the configuration of the wiring structure 10 according to the first embodiment is explained.

A process shown in FIG. 3B is the same as the process shown in FIG. 1F according to the first embodiment and is treatment such as annealing, for example. In an example shown in FIG. 3B, the first conductor 22 is more likely to be removed than the first film 26 because the diffusion velocity of copper is higher than the diffusion velocity of cobalt.

Second Embodiment

Configuration of a Wiring Structure

The configuration of a wiring structure of a semiconductor device according to the present embodiment will be described using FIG. 4A. FIG. 4A is a sectional view illustrating a wiring structure 10*b* of the semiconductor device according to the present embodiment. The configuration of the wiring structure 10*b* according to the present embodiment is nearly identical to the configuration of the wiring structure 10 according to the first embodiment except that the second film 27 and the third film 28 are not provided and the first film 26 is a different film as a result of being subjected to treatment. An explanation identical to that of the first embodiment is omitted; here, a difference from the configuration of the wiring structure 10 according to the first embodiment is explained.

The wiring structure 10*b* includes a fourth film 29 in place of the first film 26. Moreover, the second film 27 and the third film 28 are not provided.

The fourth film 29 is provided on the side surface and the bottom surface of the first conductor 22. The fourth film 29 contains a cobalt compound. The cobalt compound is cobalt nitride ($CoN_z$), for example. As will be described later with reference to FIG. 4F, the etching rate of the fourth film 29 is lower than the etching rate of the first film 26 containing cobalt. This makes it possible to prevent a void and improve reliability.

The second insulating film 14 is provided on the upper surface of the first insulating film 12, the upper surface of the first conductor 22, and the upper surface of the fourth film 29.

The first barrier film 24 is provided between the fourth film 29 and the first insulating film 12. Moreover, the first barrier film 24 that is provided on the bottom surface of the plug 30*a* is in contact with the first conductor 22 of the lower-layer wiring 20*b*.

The wiring structure 10*b* according to the present embodiment includes the fourth film 29. The fourth film 29 is provided on the side surface and the bottom surface of the first conductor 22 and contains a cobalt compound. The etching rate of the fourth film 29 that supports a stepped cut portion of the seed layer 22' of the first conductor 22 is lower than the etching rate of the first film 26 according to the first embodiment. As a result, as will be described later with reference to FIGS. 4F and 4G, it is possible to prevent a void and improve the reliability of the wirings.

Moreover, the position of the upper surfaces of the first conductor 22 and the fourth film 29 is lower than the upper surface (the surface a) of the first insulating film 12. This makes it possible to extend the distance between the lower-layer wirings and increase a breakdown voltage. This also makes it possible to extend the distance between the upper-layer wirings 30*b*.

Method for Producing the Wiring Structure

FIGS. 4B to 4G are sectional views illustrating a method for producing the wiring structure 10*b* of the semiconductor device according to the present embodiment. As compared with the first embodiment, in the method for producing the wiring structure 10*b* according to the present embodiment, the first film 26 is treated and the formation of the second film 27 and the third film 28 is not performed. An explanation identical to that of the first embodiment is omitted; here, a difference from the configuration of the wiring structure 10 according to the first embodiment is explained.

Moreover, the method for producing the wiring structure 10*b* according to the second embodiment is identical to the method for producing the wiring structure according to the comparative example except that the first film 26 is treated.

As shown in FIG. 4B, a first through via hole 13*a* and a recess portion 13*b* are formed in the upper surface of a first insulating film 12 and a first barrier film 24 and a first film 26 are formed on the internal surface and the bottom surface of the first through via hole 13*a* and the recess portion 13*b*. The first film 26 is formed by CVD, for example. The first film 26 contains cobalt, for example.

Next, as shown in FIG. 4C, a fourth film 29 containing a cobalt compound is formed by treating the first film 26. The cobalt compound is cobalt nitride ($CoN_z$), for example. The treatment which is performed on the first film 26 is NH 3 plasma treatment, for example. This makes it possible to form the fourth film 29 whose etching rate is lower than that of the first film 26.

Next, as shown in FIG. 4D, a seed layer 22' is formed via the fourth film 29.

Next, as shown in FIG. 4E, a first conductor 22 is formed in the first through via hole 13*a* and the recess portion 13*b* via the seed layer 22', annealing is performed, and the excess first conductor 22, first barrier film 24, and fourth film 29 are removed to the upper surface of the first insulating film 12 by chemical mechanical polishing. That is, the upper surface of the first insulating film 12, the upper surface of the fourth film 29, and the upper surface of the first conductor 22 are polished. The first conductor 22 contains copper, for example.

Next, as shown in FIG. 4F, a part of the fourth film 29 and a part of the first conductor 22 are removed (recessed) from the upper surface side. A part of the first conductor 22 is removed by wet etching, for example, and a part of the fourth film 29 is also removed with the part of the first conductor 22. The etching rate of the fourth film 29 in the partial removal of the fourth film 29 and the first conductor 22 is lower than the etching rate of the first film 26. As a result, in the second embodiment, as compared with the comparative example explained with reference to FIGS. 2A and 2B, it is possible to prevent a recess portion 26*r* and prevent a void 26*v*. This makes it possible to improve the reliability of the wirings.

Next, as shown in FIG. 4G, a second insulating film 14 is formed on the upper surface of the first insulating film 12 having the lower-layer wiring 20*b*, the upper surface of the first conductor 22, and the upper surface of the fourth film 29. The second insulating film 14 is a silicon carbonitride film, for example. Then, a third insulating film 16 is formed on the second insulating film 14.

By forming a plug 30*a* and an upper-layer wiring 30*b* and forming a fourth insulating film 18, it is possible to produce the wiring structure 10*b* shown in FIG. 4A.

Third Embodiment

Configuration of a Semiconductor Device

The configuration of a semiconductor device 1 according to the present embodiment will be described using FIG. 5. FIG. 5 is a sectional view showing the basic configuration of the semiconductor device 1. As shown in FIG. 5, the semiconductor device 1 is a bonded substrate and includes a memory cell array chip 100 and a control circuit (CMOS circuit) chip 200. The memory cell array chip 100 and the control circuit chip 200 are connected at a connecting surface Cl.

Structure of the Memory Cell Array Chip

As shown in FIG. 5, the memory cell array chip 100 includes a plurality of electrode layers 160, a plurality of semiconductor pillars 150, and a memory-side wiring layer 170. The plurality of electrode layers 160 and a plurality of unillustrated insulating layers are alternately stacked. The semiconductor pillars 150 are placed in a direction perpendicular to a substrate in such a way as to pass through the plurality of stacked electrode layers 160. The semiconductor pillars 150 function as a plurality of transistors including memory cells by being combined with the plurality of electrode layers 160 via the insulating layers. That is, the plurality of transistors including memory cells are three-dimensionally arranged in a memory cell array region 110. The semiconductor pillar 150 is electrically connected to a source line at one end (on the substrate side) and electrically connected to the memory-side wiring layer 170 at the other end (on the side opposite to the substrate). A connecting terminal for connection with the control circuit chip 200 is placed on the connecting surface Cl of the memory-side wiring layer 170.

A draw-out region 120 is arranged on the substrate side by side with the memory cell array region 110. In the draw-out region 120, terminal portions of the plurality of electrode layers 160 are drawn out in a staircase manner. Each terminal portion is connected to a vertical wiring via a contact hole formed in an insulating film. These vertical wirings are electrically connected to the memory-side wiring layer 170 and connected to the control circuit chip 200 via the connecting terminals.

Structure of the Control Circuit Chip

As shown in FIG. 5, the control circuit chip 200 includes a substrate 250, a plurality of transistors 260 constituting a control circuit, and a circuit-side wiring layer 270. The plurality of transistors 260 are formed on the substrate 250 and electrically connected to the circuit-side wiring layer 270 on the side opposite to the substrate 250. A connecting terminal for connection with the memory cell array chip 100 is placed on the connecting surface Cl of the circuit-side wiring layer 270. The substrate 250 may be a semiconductor wafer such as a silicon substrate.

The circuit-side wiring layer 270 includes a wiring structure 10*c*. Here, the wiring structure 10*c* corresponds to wirings and via plugs of the circuit-side wiring layer 270.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first insulating film;
a second insulating film disposed over an upper surface of the first insulating film;
a wiring disposed in the first insulating film,
wherein the wiring includes:
    a first conductor containing copper;
    a first film formed on a side surface and a bottom surface of the first conductor and containing cobalt;
    a second film formed on an upper surface of the first conductor and containing copper and silicon; and
    a third film formed on an upper surface of the first film and containing cobalt and silicon,
wherein respective positions of the second film and the third film are each lower than the upper surface of the first insulating film,
wherein the second insulating film is in contact with the second film and the third film,
wherein the wiring further includes a first barrier film formed between the first film and the first insulating film and between the third film and the first insulating film, and
wherein the barrier film is formed between the first insulating film and the second insulating film, and the second insulating film is in contact with the first barrier film.

2. The semiconductor device according to claim 1, wherein a first position of an upper surface of the second film is different from a second position of an upper surface of the third film.

3. The semiconductor device according to claim 1, wherein a first position of an upper surface of the second film is lower than a second position of an upper surface of the third film.

4. The semiconductor device according to claim 1, wherein the second insulating film is formed on each of the upper surface of the first insulating film, an upper surface of the second film and an upper surface of the third film, and containing silicon.

5. The semiconductor device according to claim 1, wherein the first insulating layer and the second insulating layer are composed of different material.

6. The semiconductor device according to claim 5, wherein the first insulating film includes silicon and oxygen, and second insulating film includes silicon and nitrogen.

7. A semiconductor device comprising:
a first insulating film;
a second insulting film disposed over an upper surface of the first insulating film; and
a wiring disposed in the first insulating film, wherein the wiring includes:

a first conductor containing copper;

a first film formed on a side surface and a bottom surface of the first conductor and containing cobalt and nitrogen, and wherein a first position of respective upper surfaces of the first conductor and the first film is lower than a second position of an upper surface of the first insulating film;

wherein the second insulating film is in contact with the first conductor and the first film;

wherein the wiring further includes a barrier film formed between the first film and the first insulating film; and wherein the barrier film is formed between the first insulating film and the second insulating film, and the second insulating film is in contact with the first barrier film.

8. The semiconductor device according to claim 7, wherein the first film contains cobalt nitride.

9. The semiconductor device according to claim 7, wherein the first insulating layer and the second insulating layer are composed of different material.

10. The semiconductor device according to claim 9, wherein the first insulating film includes silicon and oxygen, and second insulating film includes silicon and nitrogen.

11. A method for fabricating a semiconductor device, comprising:

forming a recess in a first insulating film;

forming a first film containing cobalt along an internal surface and on a bottom surface of the recess;

forming, in the recess, a first conductor containing copper;

processing an upper surface of the first insulating film, an upper surface of the first film, and an upper surface of the first conductor;

forming a material film containing silicon on the upper surface of the first insulating film, the upper surface of the first film, and the upper surface of the first conductor;

forming a second film containing copper and silicon on the upper surface of the first conductor and forming a third film containing cobalt and silicon on the upper surface of the first film by diffusing copper of the first conductor and cobalt of the first film into the material film; and removing the material film.

12. The method for fabricating a semiconductor device according to claim 11, wherein the respective upper surfaces of the first conductor and the first film are lower than the upper surface of the first insulating film.

13. The method for fabricating a semiconductor device according to claim 11, wherein the step of diffusing copper of the first conductor and cobalt of the first film into the material film comprises performing an annealing process with a temperature equal to or lower than about 300° C.

14. A semiconductor device comprising:

a first insulating film;

a second insulating film disposed over an upper surface of the first insulating film;

a wiring disposed in the first insulating film, wherein the wiring includes:

a first conductor containing copper;

a first film formed on a side surface and a bottom surface of the first conductor and containing cobalt;

a second film formed on an upper surface of the first conductor and containing copper and silicon; and a third film formed on an upper surface of the first film and containing cobalt and silicon, wherein respective positions of the second film and the third film are each lower than the upper surface of the first insulating film, wherein the second insulating film is in contact with the second film and the third film, and wherein a first position of an upper surface of the second film is lower than a second position of an upper surface of the third film.

\* \* \* \* \*